United States Patent [19]
Bankes et al.

[11] 3,970,471
[45] July 20, 1976

[54] METHODS AND APPARATUS FOR TREATING WAFER-LIKE ARTICLES

[75] Inventors: Robert B. Bankes, Reading; Walter W. Gladney, Kutztown, both of Pa.

[73] Assignee: Western Electric Co., Inc., New York, N.Y.

[22] Filed: Apr. 23, 1975

[21] Appl. No.: 570,690

[52] U.S. Cl...................................... 134/6; 15/21 D; 51/118; 118/319; 134/25 A; 134/33; 134/80; 134/134
[51] Int. Cl.².......................................... B08B 1/04
[58] Field of Search ................. 134/6, 25 A, 32, 33, 134/80, 134, 151, 153, 158, 159; 15/21 B, 21 C, 21 D; 118/319, 505; 51/118, 134, 216 T, 237 T

[56] References Cited
UNITED STATES PATENTS

| | | | |
|---|---|---|---|
| 2,439,466 | 4/1948 | Gravley | 134/6 UX |
| 2,740,375 | 4/1956 | Diehl et al. | 118/505 X |
| 3,489,608 | 1/1970 | Jacobs et al. | 134/33 X |
| 3,585,668 | 6/1971 | Jaccodine et al. | 15/21 D |
| 3,664,872 | 5/1972 | Frank et al. | 134/6 |
| 3,691,694 | 9/1972 | Goetz et al. | 51/118 X |

*Primary Examiner*—S. Leon Bashore
*Assistant Examiner*—Richard V. Fisher
*Attorney, Agent, or Firm*—G. W. Houseweart; M. Y. Epstein

[57] ABSTRACT

Wafer-like articles are inserted through an input port into one of a plurality of slots in a rotatable disc having a slotted periphery. The disc is disposed in a vertical plane between a pair of closely-spaced parallel plates which laterally retain the articles in the slots. The slots advantageously are inclined toward the direction of rotation so that the wafers tend to remain therein as rotation and treating proceeds. The rotating disc urges each article between the plates to an aperture in one of the plates through which one side of the article is exposed to a treating medium, such as a scrubbing brush and detergent solution. Further rotation of the disc brings each article to an aperture in the opposing plate through which another side of the article is exposed to another treating medium of like or different kind. Still further rotation of the disc brings each article to an exit port, which is arranged in relation to the slots for gravity discharge of the article from the disc into a suitable storage and handling mechanism. In the case of cleaning with brushes and detergents, a suitable handling medium may include a multi-slotted magazine submerged in a water reservoir. A water-bearing mechanism advantageously is used at the input and exit ports to avoid adherence of the wet articles to the opposed plates due to surface tension.

17 Claims, 2 Drawing Figures

METHODS AND APPARATUS FOR TREATING WAFER-LIKE ARTICLES

BACKGROUND OF THE INVENTION

1. FIELD OF THE INVENTION

This invention relates to methods and apparatus for treating wafer-like articles; and, more particularly, for treating thin, fragile, wafer-like articles, such as semiconductor wafers. Such treatment may include, but is not limited to, cleaning, scrubbing, abrading, grinding, and coating.

Although the invention will be described particularly with reference to an embodiment adapted for scrubbing and cleaning semiconductor wafers, it will be appreciated that the invention is not so limited. For example, the invention may be employed for treating, e.g., scrubbing and cleaning, other thin, fragile articles, such as photolithographic masks.

In the field of semiconductor manufacture, considerable attention has been directed toward reducing manual processing steps by replacing those steps with automatic machinery. Such attention is motivated not only by a desire to reduce cost, but also to improve quality by eliminating such factors as breakage and variation in the degree of treatment from article to article.

2. DESCRIPTION OF THE PRIOR ART

Prior to this invention, some mechanized apparatus has been available for treatments such as scrubbing semiconductor wafers. An early form of such apparatus is disclosed in U.S. Pat. No. 3,585,668 issued June 22, 1971 to R. J. Jaccodine et al. The Jaccodine et al. apparatus includes a substantially horizontally disposed, rotatable holder. Wafers are inserted into pockets in the holder, and rotation of the holder brings one side of the wafers to rotating brushes and detergent and rinsing mechanisms. In such apparatus the wafers are initially loaded and then scrubbed on one side, after which the wafers must be turned over if scrubbing on the other side is desired. It is generally desirable to eliminate such multiple handling.

An improvement over the above-described apparatus is disclosed in U.S. Pat. 3,664,872 issued May 23, 1972 and 3,748,677 issued July 31, 1973 to G. A. Frank et al. The Frank et al. apparatus is adapted for simultaneously scrubbing and cleaning both sides of a semiconductor wafer, inasmuch as the wafers are held in generally open slots in a vertically rotating disc. The disc conveys the wafers between a pair of opposed counter-rotating brushes within a detergent spray. The wafers are held in the disc by pockets formed by ledges overhanging the periphery of each slot.

It is advantageous to eliminate such overhanging ledges to prevent masking of those portions of the wafers which are covered by such ledges to thereby improve the cleaning of the entire surfaces of the wafers. Also, to improve the cleaning of the wafers, it is preferable not to use pockets which can trap cleaning residues and thereby detract from the cleaning of the wafers. Another reason for eliminating such pockets is that they support the wafers, which are fragile, only by small portions of the peripheries and therby subject the wafers to stresses produced by the brushes and by the water and detergent streams.

SUMMARY OF THE INVENTION

In accordance with this invention, wafer-like articles are treated by inserting the articles into open slots in a substantially plane conveying member disposed between a pair of closely spaced, immobile, parallel plates which laterally retain the articles in the slots. The member conveys the articles in succession to a first aperture in one of the plates, through which one side of each article is exposed to a first treatment. Further conveyance brings each article in succession to an aperture in the other plate, through which the other side of each article is exposed to a second treatment.

In a particular disclosed embodiment, the conveying member is a substantially plane rotatable disc having a slotted periphery. As the disc is rotated, each article is urged between the plates to an aperture in one of the plates, through which one side of the article is exposed for the desired treatment while the opposed side of the article is supported by the opposed plate. Further rotation of the disc brings each article to an aperture in an opposing plate through which the other side of the article is exposed to a desired treatment, while the first side of the article is supported by the first plate.

In the particular disclosed embodiment, the apparatus is adapted so that still further rotation of the disc brings each article to an exit port which is arranged in relation to the slots for gravity discharge of the articles form the disc.

For cleaning treatments, which typically may involve scrubbing and introduction of water and detergent streams, the disc advantageously is at least partially submerged in a liquid so that articles emerging from the disc are never exposed to air. Rather, the emerging articles exit from the disc in the liquid to avoid any drying which could result in formation of undesirable residues on the surfaces of the articles. Also for such cleaning treatments, a water-bearing mechanism advantageously is used at the input and exit ports to avoid adherence of the wet articles to the opposed plates due to surface tension.

For treatments such as cleaning semiconductor wafers, the wafers advantageously are inserted directly and automatically into the slots from a multi-slotted magazine, which is indexed synchronously with the rotation of the disc to permit wafers to transfer to the slots in the disc in sequence. Also, for such treatments, the submerged container for receiving the exiting articles advantageously is a multi-slotted magazine which also is indexed in synchronism with the rotation of the disc to avoid any manual handling of the articles whatsoever during the treatment process.

BRIEF DESCRIPTION OF THE DRAWING

The aforementioned and other features, characteristics, and advantages, and the invention in general, will be better understood from the following detailed description taken in conjunction with the accompanying drawing in which.

DETAILED DESCRIPTION

As was alluded to hereinabove, the invention will be described in detail with respect to a particular embodiment adapted for advantageously scrubbing and cleaning wafers of silicon semiconductor material. However, it is to be understood that the method and apparatus will function quite successfully for other types of articles, such as photolithographic masks, and for other types of treatment.

With current technology, silicon semiconductor material typically is processed in the form of substantially circular wafers having a diameter of one to three inches and a thickness from a few mils ($10^{-3}$ inches) to several tens of mils.

Figure 1:
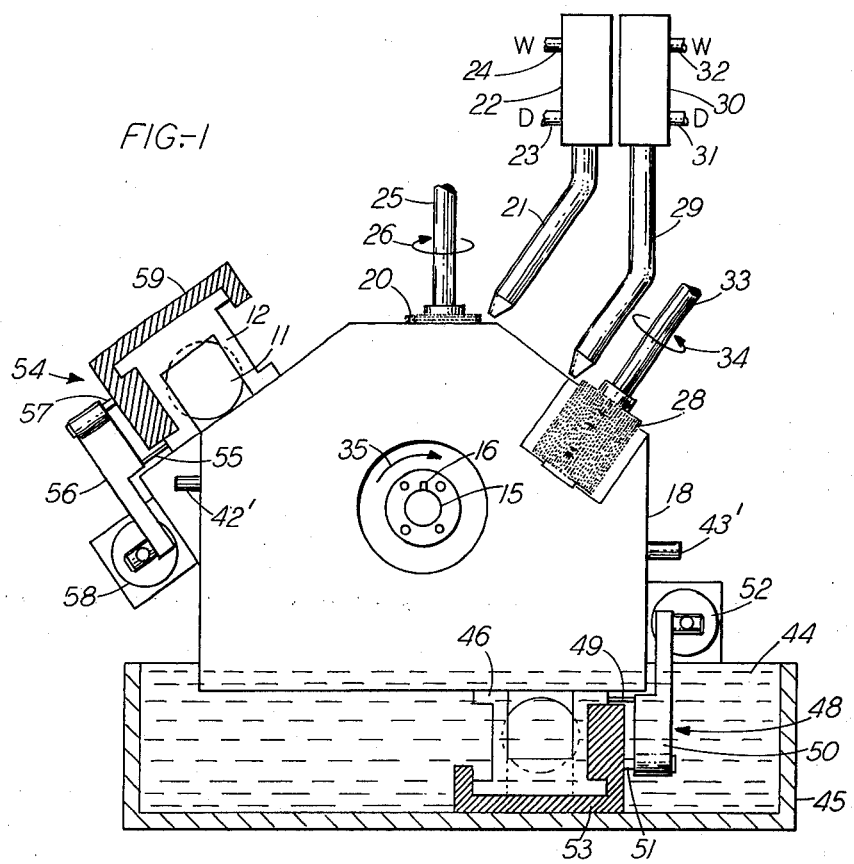
FIG. 1 is an elevational view of one embodiment for treating articles.

Referring now to the figures, wafers 11 are transferred from a wafer container, such as a multi-slotted wafer magazine 12, into a slot 13 in a disc 14. The transfer from magazine 12 to slot 13 may be accomplished manually, or preferably, by an automatic technique such as will be described later with reference to FIG. 1.

Disc 14 is a multi-slotted, plane, essentially circular member having a plurality of slots 13 open to the periphery thereof. As illustrated, slots 13 are completely open laterally, in the sense that there are no overhanging protrusions at the peripheral edges thereof. Disc 14 is mounted on a shaft 15 by a conventional slot and key arrangement 16. Shaft 15 is coupled conventionally to a motor or gear train arrangement (not shown) for imparting rotation to disc 14 via shaft 15.

Wafers 11 are retained laterally in the slots by a pair of opposed, immobile, parallel plates 17 and 18 which are spaced sufficiently closely to disc 14 so that the wafers cannot fall therebetween. In a particular application, the wafers 11 may be approximately 20 mils thick, in which case disc 14 may be typically of thickness about 25 mils and plates 17 and 18 would be spaced a few mils (in practice as close as feasible) from disc 14.

In operation, rotation of disc 14 brings each slot 13 and wafer 11 therein to a first aperture 19 through which one entire side or face of wafer 11 is exposed to a rotating brush 20 as the wafer traverses aperture 19. A nozzle 21, coupled to a manifold 22 to which can be selectively applied a detergent solution D through port 23 and water W through a port 24, is disposed so as to direct the appropriate solution onto brush 20 and aperture 19. Brush 20, as shown, is coupled to a shaft 25 which is driven by any suitable rotating means (not shown). An arrow 26 indicates a preferred, but not necessary, direction of rotation for shaft 25 and brush 20.

Further rotation of disc 14 brings each wafer successively to an aperture 27 in plate 18, through which another entire side of wafers 11 are exposed to another brush 28 and appropriate cleaning fluids. The fluids are directed onto brush 28 and aperture 27 via another nozzle 29, which also is coupled to a simple manifold 30 adapted to receive selectively a variety of solutions W and D through ports 31 and 32. As seen, brush 28 is mounted on a shaft 33 which is also coupled to and driven by rotation means (not shown). An arrow 34 indicates a preferred but not necessary direction of rotation for brush 28.

Apertures 19 and 27, as shown, advantageously are smaller in lateral extent than the articles (wafers 11) to be cleaned, to avoid any tendency for the articles to become dislodged from disc 14. However, of course, such smaller size is not necessary to the practice of this invention.

It will be seen that the slots 13 in disc 14 are inclined toward the direction of rotation of disc 14. Such direction of rotation is indicated by an arrow 35. Such inclination of the slots 13 is, of course, not necessary, but is preferred for the purpose of aiding in retaining the wafers radially in the slots as treatments proceed; and such inclination typically may be of about 30° from a radial line extending from the center of disc 14.

As assembled, plates 17 and 18 are held apart by a flat ring-like member 36, which is just slightly (a few mils) larger in internal diameter 37 than the external diameter of disc 14, and which includes an input opening 38 and an exit opening 39. Openings 38 and 39, of course, must be at least as large as the wafers being treated. Member 36 also serves to retain the wafers in the slots as they approach exit opening 39.

Opening 38, in combination with a slot 13 aligned therewith, may be thought of as an input passageway. Similarly, opening 39, in combination with a slot aligned therewith, may be thought of as a exit passageway. Aligned with the input passageway and disposed in both plates 17 and 18 are a plurality of openings, designated generally 40. The openings 40, which are inclined at an acute angle relative to the longitudinal direction of the input passageway, are for directing a fluid at that acute angle to act as a water-bearing mechanism for urging a wafer into the slot. Such directional fluid introduction is desirable to avoid sticking of wafers 11 to the wet inner surfaces of plates 17 and 18 due to surface tension. Otherwise, such sticking could be a problem due to the nearly perfectly flat wafers and internal surfaces of plates 17 and 18.

Figure 2:
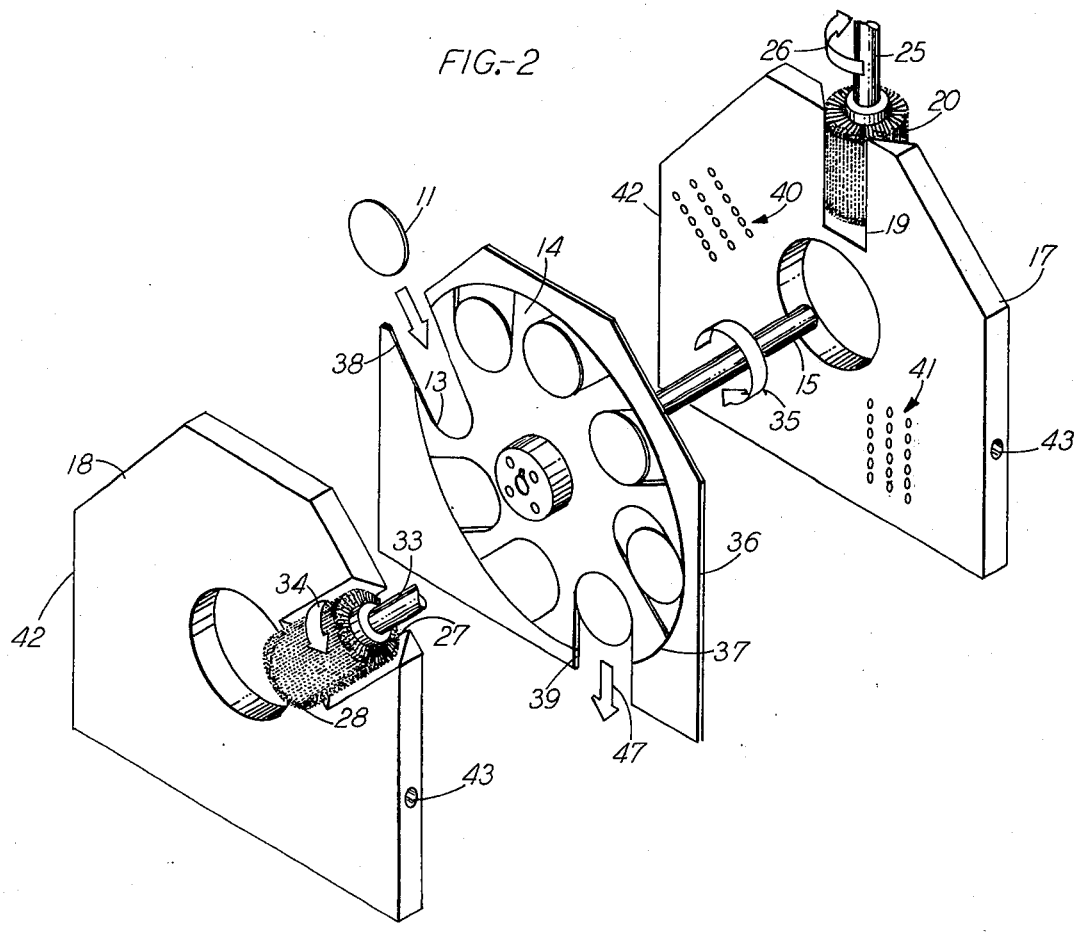
FIG. 2 is an exploded isometric view of the apparatus of FIG. 1.

A similar plurality of openings, designated generally 41, in plates 17 and 18, are aligned with the exit passageway for urging the wafers from the slots for similar reasons. Of course, the openings 40 and 41 are not visible on the inner surface of plate 18 in FIG. 2, but as will be understood, are disposed directly across from those of plates 17. Water or other suitable fluid under pressure is introduced to openings 40 and 41 via conventional tubing 42' and 43' (FIG. 1) and input ports 42 and 43, respectively, in plates 17 and 18. As will be appreciated, the water and other solutions introduced via nozzles 21 and 29 will wet the entire inner surfaces of plates 17 and 18 and of disc 14 as operation proceeds.

As shown, at least a lower portion of the apparatus including most of the exit passageway is submerged in a suitable solution 44, such as water, in a reservoir 45 so that wet slices emerging from the apparatus need not come in contact with air. Such contact could cause undesirable drying and residue formation. Disposed in solution 44 is a wafer magazine 46 having one of its slots aligned with the exit passageway, as indicated by arrow 47. A suitable indexing mechanism, designated generally 48, is synchronized with the rotation of shaft 15 so that the carrier 46 is indexed to provide the next slot aligned with passageway 47 to successively receive wafers from disc 14.

Indexing means 48 may include, for example, a sequential advancing pawl in the form of a flexible pin 49 connected to a rigid member 50. The lower end of member 50 is pivotally mounted on a pin 51; and the upper end of member 50 is pivotally connected to an air cylinder 52 or other suitable actuating means. Magazine 46 is slidably held in a track 53 in reservoir 45 so that the top of magazine 46 is in sliding contact or nearly in contact with the bottom edge of plates 17 and 18. Pin 49 engages slots (not shown) in the edge of magazine 46, which are aligned with the wafer-receiving slots, so that when air cylinder 52 is actuated synchronously with the rotation of shaft 15 and disc 14, magazine 46 is moved sufficiently to present an empty slot in magazine 46 aligned with exit passageway 47 when a wafer 11 exits from disc 14.

As mentioned above, wafers advantageously are also inserted automatically from magazine 12 into disc 14. Exemplary apparatus for such automatic insertion may include an indexing mechanism, designated generally 54, analogous to indexing mechanism 48. As shown, mechanism 54 includes a sequential advancing pawl in the form of a flexible pin 55 which engages slots in the edge of magazine 12. Pin 55 is connected to a rigid member 56 which is pivotally mounted at one end on a pin 57 and which is pivotally connected at the other end to an air cylinder 58.

Magazine 12 is slidably held in a track 59. Actuation of cylinder 58 synchronously with the rotation of shaft 15 and disc 14 allows wafers to fall in sequence through void 38 and into empty receiving slots 13 aligned with void 38.

It is important to the successful practice of a cleaning operation that the degree of scrubbing achieved is sufficient to remove tenacious particles, but not be so vigorous to result in scratching of the wafers or dislodging them from disc 14. While the proper amount of scrubbing is to some extent dependent upon such factors as time of scrubbing, speed of rotation of the brushes, speed of rotation of the disc, and speed of advancement of the disc past the brushes, it may generally be achieved in large measure by the proper choice of brushes and distance between the brush and slice surfaces.

It will be appreciated that such factors as brush stiffness and brush quality are difficult of description, being dependent upon the type, density, length, cross section and width of the bristles and upon the size and shape of the brush. By way of example only, it has been found satisfactory to use cylindrical nylon brushes, having circular cross sections of from one to four inches and bristles from one-half to one and one-half inches in length, with the bristles having a circular cross section of from 0.006 to 0.012 inch. Spacing the brush such that 1/16 to one-fourth inch of the ends of the bristles come in contact with the wafers has been found to be appropriate.

With such brushes and spacings, a speed of rotation of about 2 to 10 revolutions per minute of the disc and a brush rotation speed of approximately 10 to 350 revolutions per minute has provided suitable scrubbing with brushes of the type mentioned hereinabove. Of course, such speeds are only suggested and are not in any way required for the practice of this invention.

At this point, it is believed the principles of the invention have been described in sufficient detail to enable one skilled in the art to practice the invention. Although the invention has been described in part by making detailed reference to a specific embodiment, such detail is intended to be and will be understood to be instructive rather than restrictive. It will be appreciated that many variations may be made in the structure and in the modes of operation without departing from the spirit and scope of the invention as disclosed in the foregoing teachings.

For example, of course, a plurality of staggered openings may be provided in either both plates 17 and 18 to enable successive treatments on either or both sides of the articles. Similarly, a plurality of treating media, such as a plurality of brushes, may be provided in each or any of the one or more openings in each plate, as may appear desirable to a worker in the art for particular treating operations.

Further, the conveying member need not be a rotatable disc. It may, for example, be a substantially plane rectangular strip having a plurality of openings for receiving and conveying articles between a pair of opposed parallel plates having staggered apertures through which the articles are exposed to desired treatments. Other suitably configured members for conveying wafer-like articles between stationary, opposed lateral retaining and supporting members will no doubt occur to workers in the art, all within the spirit and scope of this invention as disclosed herein.

We claim:

1. Apparatus for treating wafer-like articles comprising:
   a substantially planar conveying member having a plurality of article-receiving slots adapted for receiving articles of a predetermined size, said slots extending through the thickness thereof, and means for moving said member to advance said slots along a path;
   an immobile first plate disposed adjacent to one side of and substantially parallel to the member, said first plate having therein a first aperture aligned with the path traversed by the slots as the articles are conveyed;
   an immobile second plate disposed adjacent to the opposite side of the member and substantially parallel to the member and to the first plate, said second plate having therein a second aperture aligned with said path;
   said first and second apertures being disposed at different positions along the path such that there are no directly opposing apertures in the plates, and each aperture being of a size to expose therethrough substantially the entire extent of one of the faces of each article advanced past said aperture;
   first means disposed adjacent to one of said apertures for treating one face of an article so exposed through said one aperture; and
   second means disposed in the other of said apertures for treating the opposite face of the articles so exposed through said other aperture.

2. Apparatus as recited in claim 1 wherein no portion of the member overhangs any portion of an article in a slot.

3. Apparatus as recited in claim 2 wherein the conveying member is disc-shaped.

4. Apparatus as recited in claim 3 including means for rotating the disc about an axis to expose successive slots and articles therein to the apertures.

5. Apparatus as recited in claim 4 wherein the first and second means are rotatable brushes for scrubbing the faces of the articles exposed through the apertures.

6. The apparatus of claim 5 including means for spraying a water detergent solution into the area of engagement of the brushes with the articles.

7. Apparatus as recited in claim 6 including:
   a fluid-tight container surrounding at least a bottom portion of said rotatable disc;
   means for maintaining a fluid level in the container sufficiently high to cover at least a portion of the disc thereby creating a fluid bath;
   means for successively discharging said articles into said bath as the disc is rotated; and
   means for positioning and automatically indexing an article-receiving, first multi-slotted magazine in the bath to receive said successively discharged articles.

8. Apparatus as recited in claim 7 including means for automatically transferring articles from a second multi-slotted magazine into successive slots as the disc is rotated.

9. Apparatus as recited in claim 8 wherein the automatic indexing means and the automatic transferring means include actuating means synchronized with the rotation of the disc.

10. Apparatus as recited in claim 4 including a retaining member around the periphery of the disc for radially retaining the articles in the slots;

the retaining member including an input passageway therethrough in a direction substantially along the plane of the disc through which individual articles can be inserted into successive slots as the disc is rotated, and including an exit passageway therethrough in a direction substantially along the plane of the disc through which individual articles can be discharged from successive slots as the disc is rotated; and at least one of the plates including, along the input passageway, means for directing a fluid at an acute angle relative to the longitudinal direction of the passageway for urging an article along the passageway and into a slot aligned with the passageway.

11. Apparatus as recited in claim 10 wherein both plates include the fluid directing means along the input passageway.

12. Apparatus as recited in claim 10 wherein the fluid directing means includes means for defining a plurality of apertures in said at least one plate along the passageway and slot, and means for defining a channel in said at least one plate communicating with said apertures, said channel inclined at said acute angle relative to the longitudinal direction of said input passageway.

13. A method for treating wafer-like articles comprising:

inserting the articles into article-receiving slots in a substantially planar article-conveying member;

conveying the articles between a pair of opposed, substantially parallel immobile plates disposed sufficiently close to the member to laterally retain the articles in the slots;

exposing the entire extent of one face of each of the articles, in succession, through a first aperture in one of said plates to a first treating operation while the article is supported by the other of said plates; and exposing the entire extend of the opposite face of each of the articles, in succession, to a second treating operation through a second aperture in said other of said plates disposed at a different position than the first aperture along the path of conveyance while the article is supported by said one of said plates.

14. A method as recited in claim 13 wherein the articles are conveyed in an arcuate path by a rotating, disc-shaped conveying member; and the first and second apertures are disposed at different angular positions along the path.

15. A method as recited in claim 14 wherein the first treating operation includes scrubbing the one face of each of the articles with a rotating brush; and the second treating operation includes scrubbing the opposite face of each of the articles with another rotating brush.

16. A method as recited in claim 15 including the step of removing the articles from the article-conveying member after they have been scrubbed by permitting the articles to fall through a fluid bath in which an article discharge portion of said member is immersed.

17. The method of claim 15 wherein each said article is supported on said conveying member at each treating operation position by being pressed by the scrubbing brush at such position against the oppositely disposed immobile plate.

* * * * *